United States Patent
Nagasawa et al.

(10) Patent No.: US 10,772,198 B2
(45) Date of Patent: Sep. 8, 2020

(54) ORGANIC INSULATOR, METAL-CLAD LAMINATE AND WIRING BOARD

(71) Applicant: KYOCERA Corporation, Kyoto-shi, Kyoto (JP)

(72) Inventors: Tadashi Nagasawa, Kirishima (JP); Satoshi Yoshiura, Kirishima (JP); Chie Chikara, Kirishima (JP)

(73) Assignee: KYOCERA CORPORATION, Kyoto (JP)

( * ) Notice: Subject to any disclaimer, the term of this patent is extended or adjusted under 35 U.S.C. 154(b) by 0 days.

(21) Appl. No.: 16/624,698

(22) PCT Filed: Jun. 26, 2018

(86) PCT No.: PCT/JP2018/024230
§ 371 (c)(1),
(2) Date: Dec. 19, 2019

(87) PCT Pub. No.: WO2019/004223
PCT Pub. Date: Jan. 3, 2019

(65) Prior Publication Data
US 2020/0128667 A1 Apr. 23, 2020

(30) Foreign Application Priority Data

Jun. 27, 2017 (JP) ................................. 2017-125277
Oct. 26, 2017 (JP) ................................. 2017-207258

(51) Int. Cl.
*H05K 1/05* (2006.01)
*B32B 27/18* (2006.01)
(Continued)

(52) U.S. Cl.
CPC ............. *H05K 1/056* (2013.01); *B32B 27/18* (2013.01); *H01B 3/44* (2013.01); *H05K 1/09* (2013.01)

(58) Field of Classification Search
CPC ..................................................... H05K 1/056
(Continued)

(56) References Cited

U.S. PATENT DOCUMENTS

| 6,121,383 A * | 9/2000 | Abdou-Sabet | .......... C08L 23/10 525/192 |
| 2014/0234614 A1 * | 8/2014 | Fujimura | .............. B32B 27/325 428/331 |

(Continued)

FOREIGN PATENT DOCUMENTS

| JP | 56-060241 A | 5/1981 |
| JP | 2003-238761 A | 8/2003 |

(Continued)

*Primary Examiner* — Stanley Tso
(74) *Attorney, Agent, or Firm* — Volpe and Koenig, P.C.

(57) ABSTRACT

An organic insulator is composed an organic resin phase as a main component. The organic resin phase includes a weather-resistant stabilizer. The organic resin phase includes an inner region and a surface region formed in at least one surface of the inner region. The surface region has a higher content ratio of the weather-resistance stabilizer than the inner region. A metal-clad laminate includes the organic insulator and a metallic foil laminated on at least one surface of the organic insulator. A wiring board includes a plurality of insulating layers composed of the organic insulator, and a metallic foil disposed between the insulating layers.

16 Claims, 5 Drawing Sheets

(51) Int. Cl.
*H01B 3/44* (2006.01)
*H05K 1/09* (2006.01)

(58) Field of Classification Search
USPC .......................................................... 174/258
See application file for complete search history.

(56) References Cited

U.S. PATENT DOCUMENTS

2015/0257277 A1    9/2015   Shirahase et al.
2019/0154891 A1*   5/2019   Arimura .............. G02B 3/0006

FOREIGN PATENT DOCUMENTS

| | | |
|---|---|---|
| JP | 2010-100843 A | 5/2010 |
| JP | 2010-123497 A | 6/2010 |
| WO | 2013/047726 A1 | 4/2013 |
| WO | 2014/050871 A1 | 4/2014 |
| WO | 2018/016527 A1 | 1/2018 |

* cited by examiner

US 10,772,198 B2

ORGANIC INSULATOR, METAL-CLAD LAMINATE AND WIRING BOARD

TECHNICAL FIELD

The present disclosure relates to an organic insulator, a metal-clad laminate and a wiring board.

BACKGROUND

High speed and high integration of LSIs and enhanced memory capacity have been advanced in recent years. This consequently leads to rapid advance in miniaturization, lightweighting and thinning of various electronic components. Heretofore, wiring boards and the like used in the field of these electronic components employ, as an insulating material, a cyclic olefin copolymer such as those described in Patent Document 1. The insulating material has been used in a copper-clad substrate including a copper foil joined to a surface thereof, and a wiring board for high frequency applications.

RELATED ART DOCUMENT

Patent Document

Patent Document 1: Japanese Unexamined Patent Publication No. 2010-100843

SUMMARY

An organic insulator in the present disclosure is composed of an organic resin phase as a main component. The organic resin phase includes a weather-resistant stabilizer. The organic resin phase includes an inner region and a surface region formed in at least one surface of the inner region. The surface region has a higher content ratio of the weather-resistant stabilizer than the inner region.

A metal-clad laminate of the present disclosure includes the organic insulator and a metallic foil laminated on at least one surface of the organic insulator.

A wiring board of the present disclosure includes a plurality of insulating layers composed of the organic insulator, and a metallic foil disposed between the insulating layers.

EMBODIMENTS

Figure 1:
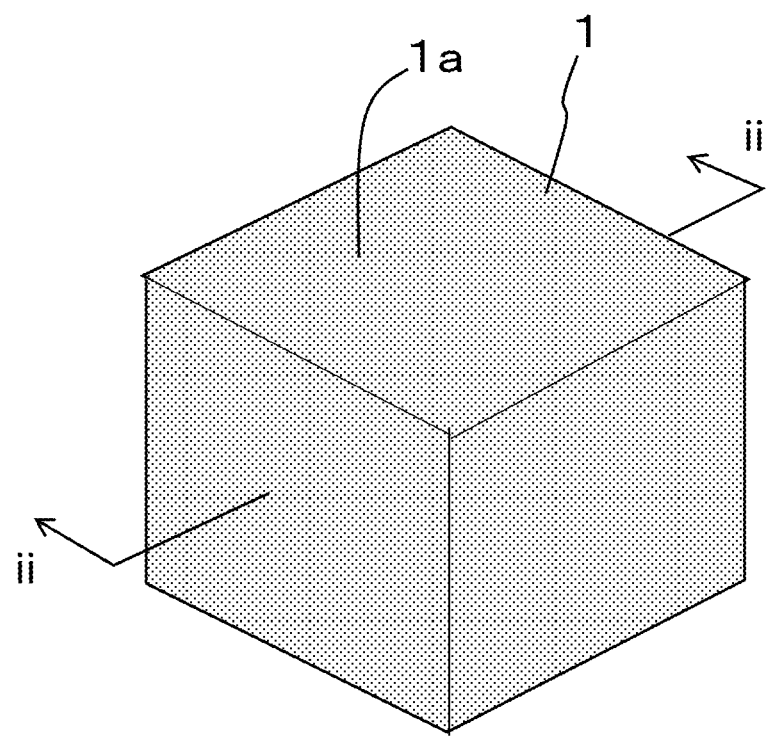
FIG. 1 is a perspective view schematically illustrating one embodiment of an organic insulator in the present disclosure.
Figure 2:
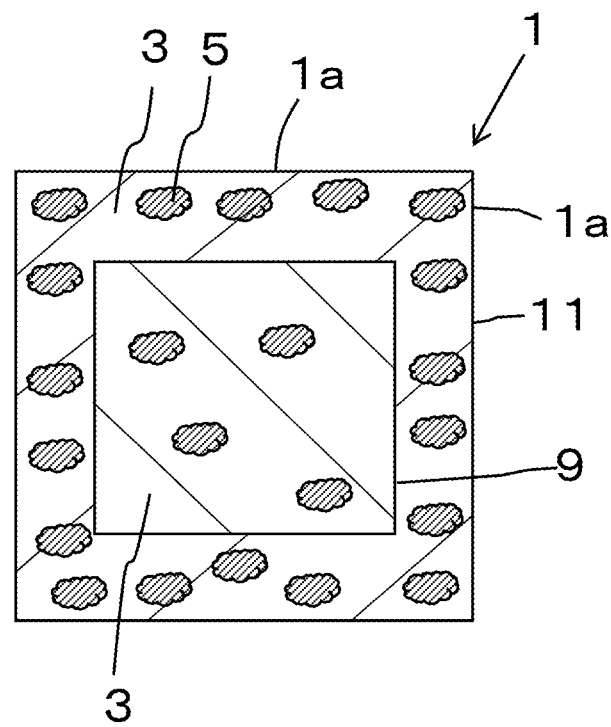
FIG. 2 is a sectional view taken along line ii-ii in FIG. 1.

Temporal stability of dielectric characteristics and heat resistance are usually needed if a metal-clad laminate including a metallic foil on a surface of an organic insulator is applied to a high-frequency wiring board. FIG. 1 is a perspective view schematically illustrating one embodiment of the organic insulator in the present disclosure. FIG. 2 is a sectional view taken along line ii-ii in FIG. 1. The organic insulator illustrated in FIG. 1 is composed an organic resin phase 3 as a main component, and includes a weather-resistant stabilizer 5.

A larger amount of the weather-resistant stabilizer 5 is included in a surface region 11 than in an inner region 9 in the organic insulator 1 as illustrated in FIG. 2. In other words, a content ratio of the weather-resistant stabilizer 5 in the inner region of the surface region 11 is higher than in the inner region 9 in the organic insulator 1. Because a larger amount of the weather-resistant stabilizer 5 is included in the surface region 11 of the organic insulator 1, the organic resin phase 3 that is a main component of the organic insulator 1 is less likely to be oxidized, for example, if the organic insulator 1 is left for a long term at a temperature higher than room temperature (25° C.). Consequently, a dissipation factor (Df) of the organic insulator 1 is less likely to increase. It is also possible to suppress a drop in glass transition temperature (Tg) due to the weather-resistant stabilizer 5 included in the organic insulator 1. In this case, the weather-resistant stabilizer 5 is preferably dispersed uniformly in the surface region 11 and the inner region 9 in the organic insulator 1.

The phrase that "the organic resin phase 3 is the main component" denotes that a ratio of the organic resin phase 3 included in the organic insulator 1 is 60 mass % or more. The term "the surface region 11 of the organic insulator 1" denotes a range that includes a surface 1a of the organic insulator 1 and extends from the surface 1a to a depth of approximately 20 μm. The inner region 9 corresponds to a region whose depth from the surface 1a is larger than 20 μm. The phrase that "the content ratio of the weather-resistant stabilizer 5 in the surface region 11 is higher than in the inner region 9" denotes cases where, if the content ratio of the weather-resistant stabilizer 5 included in the inner region 9 is taken as 1, the content ratio of the weather-resistant stabilizer 5 in the surface region 11 is 2 or more.

A distribution of the weather-resistant stabilizer 5 included in the organic insulator 1 is obtainable in the following manner. The first step is to extremely thinly polish the surface 1a of the organic insulator 1. The next step is to roughly divide regions different in tone of color by observing an exposed fresh surface of the organic insulator 1 through a scanning electron microscope. Then, a determination is made that one of the divided regions which has a large area ratio is the organic resin phase 3. A determination is also made that one of the regions which has a small area ratio is a region including the weather-resistant stabilizer 5.

Subsequently, machining is carried out so that a fresh surface is sequentially exposed by further polishing the organic insulator 1. A specific element, a large amount of which is detectable from a region having a low area ratio, is identified by an X-ray spectroscopic analysis (XPS) on the sequentially exposed fresh surfaces. Here, an examination is made on a distribution of the specific element which is not included in the region determined as the organic resin phase 3 but detectable from regions except for the organic resin phase 3. As to the content ratio of the weather-resistant stabilizer 5, for example, a comparison in count of an element indicated by an X-ray spectroscopic analysis (XPS) apparatus is made between the inner region 9 and the surface region 11 in the organic insulator 1. Specifically, a content of the weather-resistant stabilizer 5 in the surface region 11 is obtained from an average value of the counts of the element in the range of the surface region 11 which is indicated by the X-ray spectroscopic analysis (XPS) apparatus. A content of the weather-resistant stabilizer 5 in the inner region 9 is obtained from an average value of counts obtained by the X-ray spectroscopic analysis (XPS) carried out on three to five locations at a midportion in a thickness direction of the organic insulator 1. A portion including a large amount of the weather-resistant stabilizer 5 is preferably located entirely in the surface 1a of the organic insulator 1 or, alternatively, the portion may be located only in an area for which it is necessary to maintain characteristics. A structural formula of the weather-resistant stabilizer 5 is preferably found by using a Fourier Transform infrared absorption spectroscopic apparatus (FT-IR) and high performance liquid chromatography (HPLC). The content of the weather-resistant stabilizer 5 is compared according to a count number in the X-ray spectroscopic analysis (XPS). It is here regarded that one having a higher count number in XPS has a higher content of the weather-resistant stabilizer 5, and that one having a lower counter number has a low content of the weather-resistant stabilizer 5.

Figure 3:
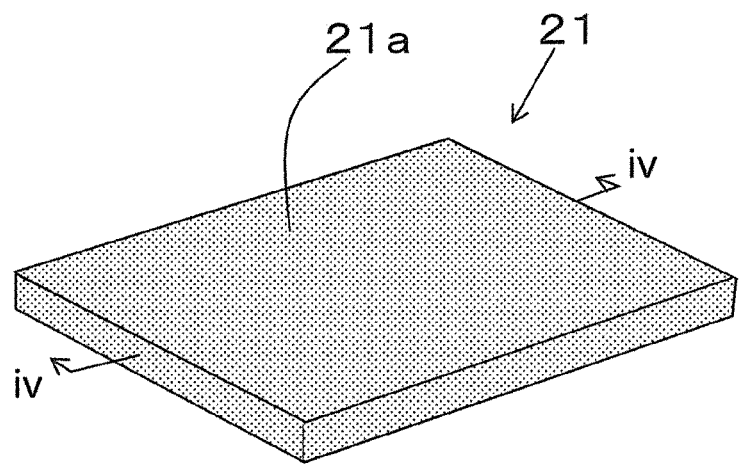
FIG. 3 is a perspective view schematically illustrating other embodiment of the organic insulator in the present disclosure.
Figure 4:
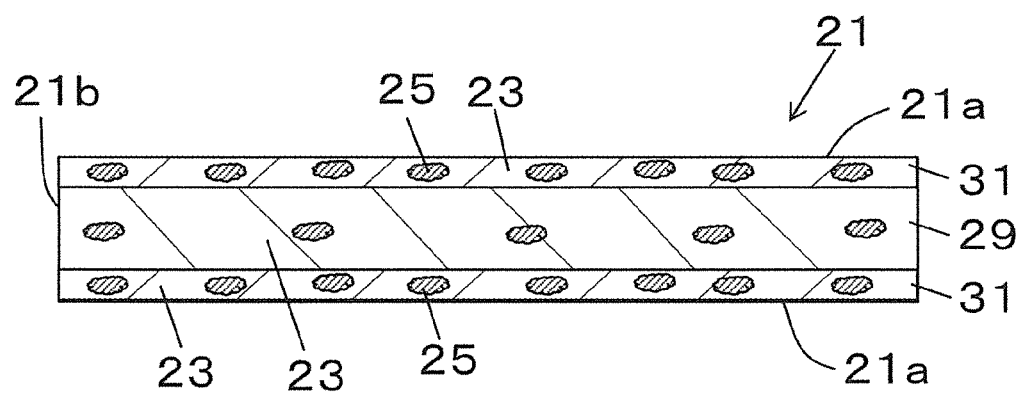
FIG. 4 is a sectional view taken along line iv-iv in FIG. 3.

FIG. 3 is a perspective view schematically illustrating other embodiment of the organic insulator in the present disclosure. FIG. 4 is a sectional view taken along line iv-iv in FIG. 3. Reference numerals of individual portions and individual members which constitute the organic insulator 21 illustrated in FIGS. 3 and 4 are as follows: 23 indicates an organic resin phase, 25 indicates a weather-resistant stabilizer, 29 indicates an inner region, and 31 indicates a surface region. An organic insulator 21 illustrated in FIGS. 3 and 4 has a plate shape. This organic insulator 27 also includes the organic resin phase 23 and the weather-resistant stabilizer 25. Also in this organic insulator 21, the content ratio of the weather-resistant stabilizer 25 in the surface region 31 is higher than in the inner region 29. In this organic insulator 21, a region where the content ratio of the weather-resistant stabilizer 25 is higher than in the inner region 29 is preferably located at a side of the main surface 21a of the organic insulator 21. A difference in content ratio of the weather-resistant stabilizer 25 between the surface region 31 and the inner region 29 in the organic insulator 21 is similar to that in the organic insulator 1 illustrated in FIGS. 1 and 2.

Although depending on a thickness of the organic insulator 21, the surface region 31 of the organic insulator 21 is preferably in a ratio of 0.05-0.3 in terms of depth from the main surface when the thickness of the organic insulator 21 is taken as 1. The inner region 29 of the organic insulator 21 preferably has a thickness of in a ratio range of 0.4 to 0.9 when the thickness of the organic insulator 21 is taken as 1.

A content ratio of the weather-resistant stabilizer 25 included in the surface region 31 of the organic insulator 21 is preferably 2 or more when a content ratio of the weather-resistant stabilizer 25 included in the inner region 29 is taken as 1. Because, in the organic insulator 21, a large amount of the weather-resistant stabilizer 25 is included in the surface region 31 of the organic insulator 21, the organic resin phase 25 is therefore less likely to be oxidized as in the organic insulator 1, for example, if the organic insulator 21 is left for a long term at a temperature higher than room temperature (25° C.). Consequently, dielectric properties are less likely to deteriorate. The glass transition temperature (Tg) of the organic insulator 21 is also less likely to descend. Also in this case, the weather-resistant stabilizer 25 is preferably dispersed uniformly in each of the surface region 31 and the inner region 29 in the organic insulator 21.

The part having a high content ratio of the weather-resistant stabilizer 25 (the surface region 31) is preferably located at a side of each of two opposing main surfaces 21a in the organic insulator 21. Alternatively, a side surface 21b of the organic insulator 21 may include such a structure that a part having a low content ratio of the weather-resistant stabilizer 25 is interposed between parts having a high content ratio of the weather-resistant stabilizer 25 in the thickness direction of the organic insulator 21. In cases where the organic insulator 21 includes a plate or film shape of a small thickness, even if a part serving as the inner region 29 is exposed on the side surface 21b of the organic insulator 21, an area thereof is narrower than an area of the main surface 21a. Accordingly, the organic resin phase 23 is less likely to be oxidized only by disposing the part having the high content ratio of the weather-resistant stabilizer 25 on the side of the main surfaces 21a having the large area.

Resistance to oxidation of the organic insulators 5 and 25 can be enhanced by incorporating a large amount of the weather-resistant stabilizer 5 and 25 into the organic insulators 1 and 21, respectively. However, an excessively high content of the weather-resistant stabilizers 5 and 25 may result in a drop in glass transition temperature (Tg) of the organic insulators 1 and 21. To avoid this, the part having the high content ratio of the weather-resistant stabilizer 5 and 25 preferably include a layer shape in the organic insulators 1 and 21. If the part having the high content ratio of the weather-resistant stabilizers 5 and 25 include the layer shape in the surface regions 11 and 31 of the organic insulators 1 and 21, it is possible to dispose the regions having a high concentration of the weather-resistant stabilizers 5 and 25 in a small thickness range in the surface regions 11 and 31 of the organic insulators 1 and 21. This leads to further enhancement of the resistance to oxidation. With this configuration, the weather-resistant stabilizers 5 and 25 are respectively concentrated in the surface regions 11 and 31, thereby increasing a volume ratio of the inner regions 9 and 29 that occupy most of the organic insulators 1 and 21. Under conditions of a large volume ratio of a part having a low content ratio of the weather-resistant stabilizers 5 and 25, the glass transition temperature (Tg) of the organic resin phases 3 and 23 is less likely to drop, thereby enhancing heat resistance. Although depending on a thickness of the organic insulator 21, a thickness of a portion having the layer shape in the part having the high content ratio of the weather-resistant stabilizers 5 and 25 is preferably a ratio of 0.05-0.3 when the thickness of the organic insulator 21 is taken as 1. Also in this case, the weather-resistant stabilizer 5 is preferably dispersed uniformly in each of the surface region 31 and the inner region 29 in the organic insulator 21. The part including the large content of the weather-resistant stabilizer 5 is preferably located over the entirety of the surface 1a of the organic insulator 1 or, alternatively may be disposed only in a part for which it is necessary to maintain characteristics. A distribution and a structural formula of the weather-resistant agent 25 included in the organic insulator 21 are obtainable from the same method as in the above organic insulator 1.

Examples of the weather-resistant stabilizer 5 includes phosphite-based heat-resistant stabilizers, such as tris(2, 4-di-tert-butylphenyl)phosphite, bis[2,4-bis(1,1-dimethylethl)-6-methylphenyl]ethyl ester phosphorus acid, tetrakis (2,4-di-tert-buthylphenyl) [1,1-biphenyl]-4,4'-diylbisphosphonate, and bis(2,4-di-tert-buthylphenyl)pentaerythritol diphosphate; lactone-based heat-resistant stabilizers, such as a reaction product of 3-hydroxyl-5,7-di-tert-butyl-furan-2-one and o-xylene; hindered phenol-based polymers, such as 3,3',3'',5,5',5''-hexa-tert-butyl-a,a',a''-(methylene-2,4,6-triy 1)tri-p-cresol, 1,3,5-trimethyl-2,4,6-tris(3,5-di-tert-butyl-4-hydroxylphenyl)benzylbenzene, pentarythritol tetrakis[3-(3, 5-di-tert-butyl-4-hydroxylphenyl)propionate], octadecyl-3-(3,5-di-tert-butyl-4-hydroxylphenyl)propionate, and thiodiethylenbis[3-(3,5-di-tert-butyl-4-hydroxyphenyl) propyonate]; sulfur-based polymers; and amine-based polymers. The weather-resistant stabilizer 5 may be used singly or in combination of two or more kinds. Of these, the phosphite-based heat-resistant stabilizers, the hindered amine-based polymers and the hindered phenol-based polymers are preferred. For example, nitrogen (N) is suitable as an element detected for identifying a hindered amine-based polymer.

The weather-resistant stabilizers 5 and 25 are preferably included in a range of 0.01 mass parts or more but 10 mass parts or less in the inner regions 9 and 29 and the surface regions 11 and 31 when the content of each of the organic resin phases 3 and 23 is taken as 100 mass parts. By incorporating the stabilizers 5 and 25 in the above ratio, it is possible to suppress an increase in dissipation factor while enhancing the resistance to oxidation and heat resistance of weather-resistant of the organic insulators 1 and 21. In this case, a content in terms of mass part of the weather-resistant stabilizers 5 and 25 is assumed to be equivalent to an area ratio of the weather-resistant stabilizers 5 and 25 projected on a cross-sectional photograph obtainable through a scanning electron microscope, and is found using a specific gravity (for example, a specific gravity of each of the organic resin phase 23 and the weather-resistant stabilizers 5 and 25 is 1.05).

Figure 5:
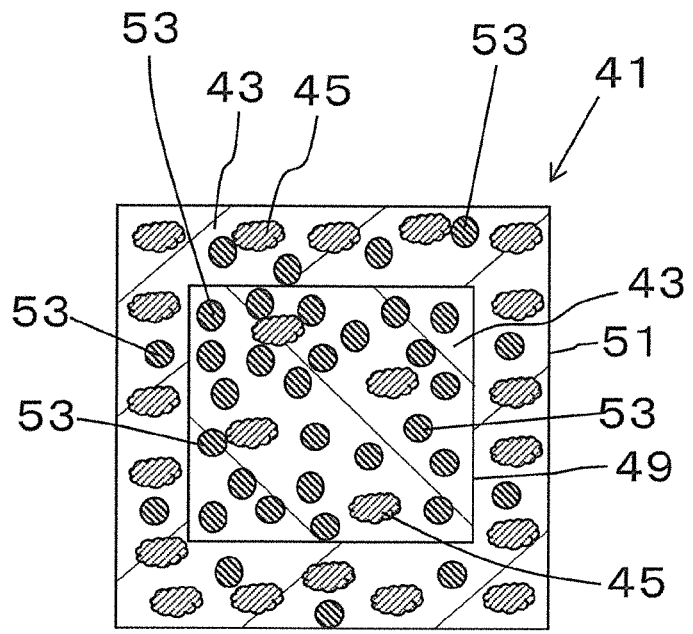
FIG. 5 is a sectional view schematically illustrating one embodiment further including inorganic particles in the organic insulator.

FIG. 5 is a sectional view schematically illustrating one embodiment that further includes inorganic particles in an organic insulator. The organic insulator 41 illustrated in FIG. 5 indicates cases where the organic insulator 1 illustrated in FIG. 2 further includes the inorganic particles. Reference numerals of individual portions and individual members which constitute the organic insulator 41 illustrated in FIG. 5 are as follows: 43 indicates an organic resin phase, 45 indicates a weather-resistant stabilizer, 49 indicates an inner region, 51 indicates a surface region, and 53 indicates inorganic particles.

The organic insulator 41 may further include the inorganic particles 53 in addition to the weather-resistant stabilizer 45 as illustrated in FIG. 5. In this case, a plurality of the inorganic particles 53 are included in the organic insulator 41. A content ratio of the inorganic particles 53 in the surface region 51 is preferably lower than in the inner region 49 in the organic insulator 41. If the content ratio of the inorganic particles 53 is lower than in the inner region 49 incases where a larger ratio of the weather-resistant stabilizer 45 is included in the surface region 51 than in the inner region 49 in the organic insulator 41, it is possible to increase an occupancy rate of the organic resin phase 43 exposed to the surface 41a of the organic insulator 41. A higher occupancy rate of the organic resin phase 43 in the surface 41a of the organic insulator 41 leads to enhanced adhesion strength to a metallic foil attached as, for example, a conductor layer, to the surface 41a of the organic insulator 41.

Figure 6:
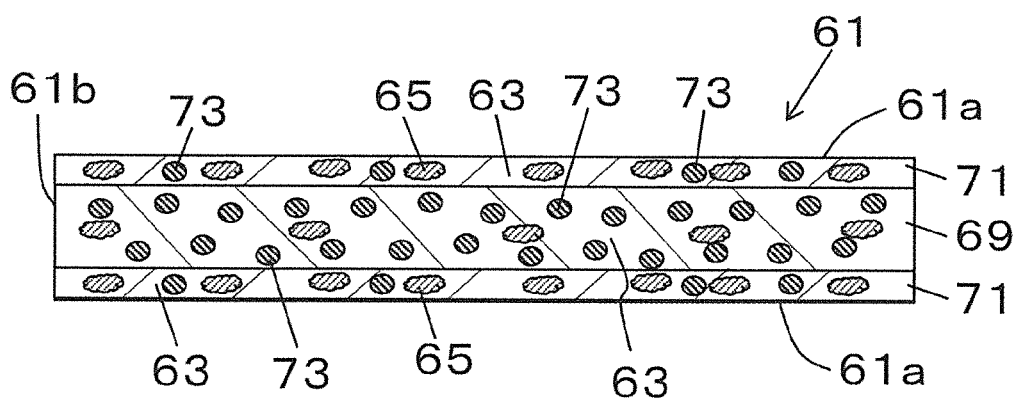
FIG. 6 is a sectional view schematically illustrating other embodiment further including inorganic particles in the organic insulator.

FIG. 6 is a sectional view schematically illustrating other embodiment that further includes inorganic particles in an organic insulator. The organic insulator illustrated in FIG. 6 shows cases where the organic insulator 21 illustrated in FIG. 4 further includes the inorganic particles. Reference numerals of individual portions and individual members which constitute the organic insulator 61 illustrated in FIG. 6 are as follows: 63 indicates an organic resin phase, 65 indicates a weather-resistant stabilizer, 69 indicates an inner region, 71 indicates a surface region, and 73 indicates inorganic particles.

The organic insulator 61 also further includes the inorganic particles 73 in addition to the weather-resistant stabilizer 65 as illustrated in FIG. 6. A plurality of the inorganic particles 73 are included in the organic insulator 61. A content ratio of the inorganic particles 73 in the surface region 71 is preferably lower than in the inner region 69 in the organic insulator 61. This case also achieves enhanced adhesion strength to a metallic foil attached as a conductor layer to the surface 61a of the organic insulator 61.

The surface region 71 having a low content ratio of the inorganic particles 73 is preferably formed on both opposing main surfaces 61a in the organic insulator 61 illustrated in FIG. 6. This makes it possible to deposit the metallic foil with high adhesion strength on the both main surfaces 61 of the organic insulator 61. In the above organic insulators 41 and 61, the inorganic particles 73 are preferably dispersed uniformly in each of the surface regions 51 and 71 and the inner regions 49 and 69 in the organic insulators 41 and 61.

The phrase that "the content ratio of the inorganic particles 53 and 73 in the surface regions 51 and 71 is lower than in the inner regions 49 and 69" denotes cases where the content ratio of the inorganic particles 53 and 73 in the surface regions 51 and 71 is 0.4 or more but 0.7 or less when the content ratio of the inorganic particles 53 and 73 included in the inner regions 46 and 69 is taken as 1.

Evaluations of the content ratios of the inorganic particles 53 and 73 included in the organic insulators 41 and 61 are obtainable in the following manner. For the sake of convenience, the following description is made using the reference numerals assigned to the organic insulator 61. A content ratio of the inorganic particles 53 included in the organic insulator 41 is evaluated in a similar manner.

Specifically, the surface 61a of the organic insulator 61 is firstly polished extremely thinly. Thereafter, the polished surface is observed through a scanning electron microscope so as to roughly divide the surface into regions different in tone of color. A region having a large area ratio among the divided regions is determined as an organic resin phase 63, and a region except for a region identified as the weather-resistant stabilizer 65 is determined as a region of the inorganic particles 73. Subsequently, the organic insulator 61 is further polished to machine so as to sequentially expose fresh surfaces. An elementary analysis using the scanning electron microscope including an energy dispersive X-ray analyzer is carried out on the sequentially exposed fresh surfaces to identify a specific element, a large amount of which is detected from the regions except for the regions of the organic resin phase 63 and the weather-resistant stabilizer 65. This includes examining a distribution of the specific element which is not included in the regions respectively determined as the organic resin phase 63 and the weather-resistant stabilizer 65, and which is detectable from regions except for the organic resin phase 63 and the weather-resistant stabilizer 65.

If a contour of the inorganic particles 73 is observable, a content ratio of the inorganic particles 73 may be obtained from an area ratio of the inorganic particles 73 projected on a cross-sectional photograph obtainable from the scanning electron microscope. In this case, the area ratio of the inorganic particles 73 in the surface region 71 of the organic insulator 61 is taken as an average value of area ratios obtained in a range of 3 µm or more but 6 µm or less from the surface 61a of the organic insulator 61. The area ratio of the inorganic particles 73 in the inner region 69 of the organic insulator 61 is obtained by carrying out the same analysis as above on three to five locations at a midportion in a thickness direction of the organic insulator 61. This is followed by a comparison between the area ratio of the inorganic particles 73 in the surface region 71 and the area ratio of the inorganic particles 73 in the inner region 69 in the organic insulator 61.

The inorganic particles 73 are preferably set to 5 mass parts or more but 40 mass parts or less in the inner region 69 and the surface region 71 when the content of the organic resin phase 63 is 100 mass parts. Toughness and mechanical strength of the organic insulator 61 can be enhanced by incorporating the inorganic particles 73 in the above ratio. A dissipation factor of the organic insulator 61 is less likely to increase also due to the inorganic particles 73. Assuming that the area ratio is equivalent to a volume ratio, a content of the inorganic particles 73 in terms of mass parts is obtained by using a specific gravity (for example, silica (quartz): 2.5).

The inorganic particles 73 are preferably the following metal oxides. For example, it is possible to use at least one selected from the group consisting of silica, talc, mica, clay, titanium oxide, barium titanate, glass beads and glass hollow balls. Carbonates, such as calcium carbonate, is also usable besides the metal oxides. Examples of silica include ground silica and fused silica, and these may be used singly or in a mixture of two or more kinds. Specific examples thereof include methacrylsilane treated fused silica: SFP-130MC (manufactured by Denka Company Limited), and FUSELEX E-2, Adma FineSO-C5 and PLV-3 (each being manufactured by Tatsumori Ltd.). The inorganic particles 73 preferably has a particle diameter of 0.03 µm or more but 2 µm or less. The inorganic particles 73 are preferably ones in which frequency of particle diameter of 1 µm or less becomes maximum when the number of the inorganic particles 73 is counted and frequency every 1 µm in particle diameter is calculated.

The organic insulator 61 preferably includes a flame retardant agent. This is also true for the organic insulators 1, 21 and 41. Compared with the weather-resistant agent 65 and the inorganic particles 73, the flame retardant agent preferably has a smaller content ratio difference between the surface region 71 and the inner region 69. The content ratio of the flame retardant agent in the organic insulator 61 is preferably set so that a content ratio of the flame retardant agent included in the surface region 71 is 0.9 or more but 1.1 or less when the content ratio of the flame retardant agent included in the inner region 69 of the organic insulator 61 is taken as 1. Specifically, the content ratio difference in flame regardant agent between the inner region 69 and the surface region 71 in the organic insulator 61 is preferably small. In a state in which the flame retardant agent is thus approximately uniformly dispersed, it is possible to reduce a range of apart of the inorganic insulator 61 in which combustion quality locally becomes higher. Fire spread is less likely to occur in the organic insulator 61, thereby enhancing flame retardance as a whole.

The analysis of the flame retardant agent is preferably carried out using a scanning electron microscope including an energy dispersive X-ray analyzer. If the flame retardant agent has a tone of color different from those of the organic resin phase 63, the weather-resistant stabilizer 65 and the inorganic particles 73, the number of the flame retardant agent existing in a predetermined area is counted from a cross-sectional photograph taken after observation so as to evaluate a difference between the surface region 71 and the inner region 69. If it is difficult to identify the flame retardant agent from the difference in tone of color, there is a need to employ a method for carrying out identification by individually analyzing a specific element (for example, bromine (Br)) that is included in the flame regardant agent but not included in the organic resin phase 63, the weather-resistant stabilizer 65 and the inorganic particles 73.

Examples of the flame retardant agent include melamine phosphate, melam polyphosphate, melem polyphosphate, melamine pyrophosphate, ammonium polyphosphate, red phosphorus, aromatic phosphate, phosphonate, phosphinate, phosphine oxide, phosphazene, melamine cyanurate, and bromine-based flame retardant agent (e.g., ethylene bis-pentabromobenzene, ethylene bistetrabromophthalimide and 1,2-bis(2,3,4,5 6-pentabromophenyl)ethane). These flame retardant agents may be used singly or in combination of two or more kinds. The flame retardant agent is preferably included in an amount of 15 mass parts or more but 45 mass parts or less when a content ratio of the organic resin phase 63 is 100 mass parts. The flame retardant agent included in the above amount makes it possible to further improve flame resistance and heat resistance while minimizing influences on dissipation factor, adhesion and moisture resistance. A particle diameter of the flame retardant agent is preferably 0.05 µm or more but 5 µm or less. The flame retardant agents are preferably ones in which frequency of particle diameter of 1 µm or less becomes maximum when the number of the flame retardant agent is counted and frequency every particle diameter of 1 µm is calculated. In this case, the amount of the flame retardant agent in terms of mass is obtained by using a specific gravity of the flame retardant agent (for example, SAYTEX801 (1,2-bis (2,3,4,5,6-pentabromophenyl) ethane having a specific gravity of 2.8).

Figure 7:
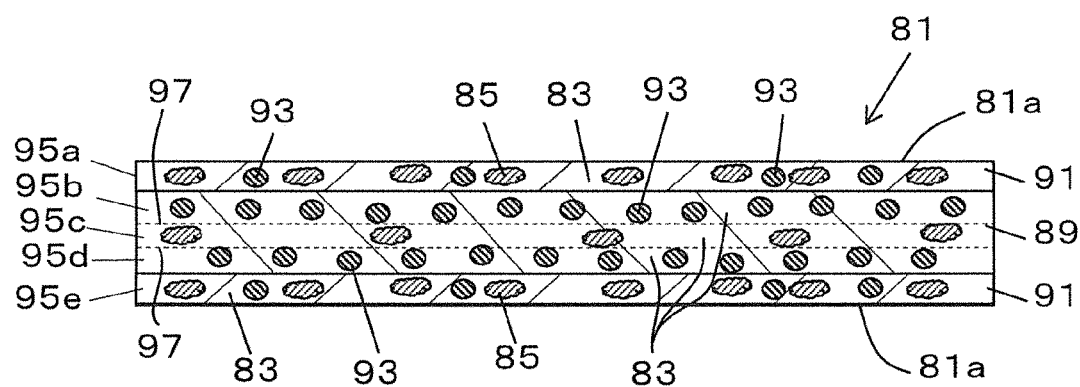
FIG. 7 is a sectional view schematically illustrating still other embodiment of the organic insulator.

FIG. 7 is a sectional view schematically illustrating still other embodiment of the organic insulator. Reference numerals of individual portions and individual members which constitute the organic insulator 81 illustrated in FIG. 7 are as follows: 83 indicates an organic resin phase, 85 indicates a weather-resistant stabilizer, 89 indicates an inner region, 91 indicates a surface region, 93 indicates inorganic particles, and 95a, 95b, 95c, 95d and 95e indicate a unit layer.

The organic resin phase 83 includes a layer structure in the organic insulator 81 illustrated in FIG. 7. Specifically, the organic resin phase 83 includes the layer structure composed of a plurality of unit layers 95a, 95b, 95c, 95d and 95e (which are also hereinafter indicated by reference numeral 95) in the organic insulator 81. In this case, at least one of content ratios of the weather-resistant stabilizer 85 and the inorganic particles 93 is preferably lower than at a midportion in a thickness direction in a region near an interface 97 in which the unit layers 95 are in contact with each other. With the structure that at least one of the weather-resistant stabilizer 85 and the inorganic particles 93 in the region near the interface 97 in which the unit layers 95 constituting the organic resin phase 83 are in contact with each other, a content ratio of the organic resin can be enhanced in the interface 97, thus leading to enhanced insulation properties between the unit layers 95. This makes it possible to obtain a thinned organic insulator 81. It is therefore possible to form the organic insulator 81 including the unit layers 95 whose average thickness is 5-20 µm.

For example, in the organic insulator illustrated in FIG. 7, there is a need to have a relationship of SO/S1>FO/F1 where S1 is a content ratio of the weather-resistant stabilizer 85 included in the inner region 89, SO is a content ratio of the weather-resistant stabilizer 85 included in the surface region 91, F1 is a content ratio of the flame retardant agent included in the inner region 89, and FO is a content ratio of the flame retardant agent included in the surface region 91. If satisfying the above relationship between the inner region 89 and the surface region 91 in the organic insulator in terms of content ratios of the weather-resistant agent 85 and the flame retardant agent, it is possible to enhance adhesion with the metallic foil on the surface of the organic insulator. It is also possible to make the organic insulator less likely to burn while enhancing resistance to oxidation as a whole.

As a material of the organic resin phases 3, 23, 43, 63 and 83 (hereinafter indicated using reference numeral 3 as a representative), a resin composition is preferred which is composed mainly of a cyclic olefin copolymer and includes peroxide. The peroxide preferably includes a benzene ring. The organic insulator 1 is preferably a thermosetting organic compound. This thermosetting organic compound is preferably composed mainly of a cyclic olefin copolymer. An organic insulator whose temperature dependency is small and whose dielectric constant and dissipation factor in a high frequency range are low is obtainable by applying a material composed mainly of a cyclic olefin copolymer including thermosetting properties to the organic resin phase 3. The dielectric properties are, for example, as follows. A dielectric constant at 30 GHz is 2.7 or less and a dissipation factor is 0.0025 or less at 125° C.

The cyclic olefin copolymer is a polyolefin-based copolymer having a cyclic structure. More specifically, the cyclic olefin copolymer is a copolymer of a cyclic olefin and other monomer copolymerizable with the cyclic olefin. The ratio of the cyclic olefin and the other monomer is not particularly limited. For example, it is preferred that the cyclic olefin is included in an amount of approximately 10-80 mass % and the other monomer is included in an amount of approximately 20-90 mass %. Examples of the cyclic olefin include a norbornene-based monomer, a cyclic diene-based monomer and a vinyl alicyclic hydrocarbon-based monomer. Specific examples of the cyclic olefin include norbornene, vinylnorbornene, phenylnorbornene, dicyclopentadiene, tetracyclododecene, cyclopropene, cyclobutene, cyclopentene, cyclohexene, cyclohexadiene and cyclooctadiene. These cyclic olefins may be used singly or in combination of two kinds or more.

The cyclic olefin copolymer with the thermosetting properties preferably includes a crosslinkable functional group in a molecule. Examples of the crosslinkable functional group includes groups with which a crosslinking reaction can proceed by radical derived from a peroxide including a benzene ring. Examples of the functional group include a vinyl group, an allyl group, an acryl group and a methacryl group. As the cyclic olefin copolymer, for example, LCOC-4 manufactured by Mitsui Chemicals, Inc. can be used suitably. In this case, at least one kind selected from the group consisting of a vinyl group, an allyl group, an acryl group and a methacryl group is usable as the crosslinkable functional group.

The peroxide including a benzene ring acts as a radical initiator. Specifically, the peroxide is used for crosslinking the cyclic olefin copolymer having a crosslinkable functional group in a molecule through a radical reaction. With the use of the peroxide, a resin composition having a lower dissipation factor and a higher glass transition temperature (Tg) is obtainable than with a peroxide including no benzene ring in a molecule. This seems to be because radical spices derived from the peroxide having a benzene ring in a molecule is easily mixed with a crosslinking moiety in the cyclic olefin copolymer and because an active group in the peroxide tends to react preferentially with a crosslinking moiety in the cyclic olefin copolymer. From the viewpoint of this reactivity, a peroxide having at least two benzene rings in a molecule is preferably used. Examples of the peroxide having a benzene ring in a molecule include t-butyl peroxybenzoate, $\alpha,\alpha'$-di-(t-butylperoxy)diisopropylbenzene, t-butylcumylperoxide and dicumylperoxide. These compounds are commercially available under the name of, for example, "PERCURE-VS", "PERBUTYL P", "PERBUTYL C" and "PERCUMYL D" (each manufactured by NOF CORPORATION).

The peroxide having a benzene ring is preferably included in an amount of 1 mass % or more but 3 mass % or less in the resin composition when a total amount of the cyclic olefin copolymer and the peroxide is 100 mass %. If the peroxide having a benzene ring in a molecule included in the above amount, the crosslinking reaction of the cyclic olefin copolymer can proceed efficiently and the dissipation factor can be further decreased.

The resin composition may further include a monomer having at least two ethylenic unsaturated groups in the molecule. This monomer serves as a crosslinking agent between the cyclic olefin copolymers. Because this monomer exists in a small molecular weight state in the resin composition, the monomer is likely to enter between the cyclic olefin copolymers. Further, because of an organic molecule having two or more ethylenic unsaturated groups, the monomer has the nature that it is liable to react with crosslinkable moieties of a plurality of adjacent cyclic olefin copolymers. Consequently, it becomes possible to enhance a glass transition temperature (Tg).

Examples of the monomer include tricylodecane dimethanol diacrylate, tricylodecane dimethanol dimethacrylate and triallyl isocyanurate. Of these, tricylodecane dimethanol diacrylate is preferred. If tricylodecane dimethanol diacrylate is included in the resin composition, the glass transition temperature (Tg) is 150° C. or above, and it becomes possible to reduce a rise rate of dissipation factor after being left at high temperatures. In this case, a content ratio of the monomer is preferably 1 mass parts or more but 8 mass parts or less relative to 100 mass parts of the cyclic olefin copolymer.

If the above monomer exists in the resin composition, the monomer exists between the cyclic olefin copolymers. This leads to a cured material in which the cyclic olefin copolymers are strongly crosslinked with each other by the existing two or more ethylenic unsaturated groups. Specifically, it is possible to obtain a cured material (organic insulator) whose glass transmission temperature (Tg) after being cured is 143° C. or above. Electrical characteristics are as follows. A dielectric constant at room temperature (25° C.) or below, and frequency of 30 GHz is 2.7 or less, and a dissipation factor under the same conditions is 0.002 or less. It is possible to obtain a cured material (organic insulator) whose dissipation factor is small if being left for a long term (for example, 1000 hours or more) under environment higher than room temperature (25° C.) (for example 125° C.)

If the organic resin phase 3 is composed of a cyclic olefin copolymer, the organic resin phase 3 is preferably composed mainly of a thermosetting cyclic olefin copolymer (thermosetting COC) from the viewpoint of heat resistance. However, if a predetermined amount or more of the thermosetting cyclic olefin copolymer is included as a main component of the organic insulator 1, a complex with the thermosetting cyclic olefin copolymer (thermosetting COC) may be used.

In cases where the organic resin phase 3 is a complex of a thermosetting cyclic olefin copolymer and a thermoplastic cyclic olefin copolymer, a dissipation factor peak obtainable by dynamic viscoelasticity measurement preferably appears at two points, i.e., a point in a temperature range of 120-150° C. and a point in a temperature range of 80 to 100° C. The dissipation factor of the organic insulator 1 can be further decreased if the organic resin phase 3 is the complex of the thermosetting cyclic olefin copolymer and the thermoplastic cyclic olefin copolymer.

The dielectric constant and dissipation factor of the organic insulator, can be further decreased if the organic resin phase 3 is the complex of the thermosetting cyclic olefin copolymer and the thermoplastic cyclic olefin copolymer than cases where the cyclic olefin copolymer is a thermosetting cyclic olefin copolymer. In this case, the dielectric properties of the organic insulator 1 preferably satisfy the conditions that the dielectric constant is 2.69 or less and the dissipation factor is 0.0019 or less at 30 GHz. A content of the thermosetting cyclic olefin copolymer included in the organic resin phase 3 is preferably 60 mass % or more but 80 mass % or less. A content of the thermoplastic cyclic olefin copolymer included in the organic resin phase 3 is preferably 20 mass % or more but 40 mass % or less.

The organic insulator 1 may include additives, such as stress releaser, antioxidant, thermal stabilizer, antistatic agent, plasticizer, pigment, dye and coloring agent, may be included as far as they do not hinder the effects of the organic insulator 1. Specific examples of the additives include "R-42" (manufactured by Sakai Chemical Co., Ltd.) and IRGANOX1010 (manufactured by BASF).

The stress releaser is not particularly limited, and examples thereof include silicone resin particles. As the silicone resin particles, there are, for example, KMP-597 (manufactured by Shin-Etsu Chemical Co., Ltd.) and X-52-875 (manufactured by Shin-Etsu Chemical Co., Ltd.), each being silicone rubber particle, and KMP-590 (manufactured by Shin-Etsu Chemical Co., Ltd.) and X-52-1621 (manufactured by Shin-Etsu Chemical Co., Ltd.), each being silicon resin powder. These stress releasers may be used singly, or two or more kinds may be used in combination. Alternatively, it is possible to use a stress releaser having a mean particle diameter of 10 μm or less. The use of the stress releaser having the above mean particle diameter contributes to further improving adhesion between the organic insulator and a metallic foil. Alternatively, the stress releaser may be included in an amount of 1 mass parts or more but 10 mass parts or less when a total amount of the cyclic olefin copolymer and the peroxide is 100 mass parts. In cases where the resin composition is used for a metal-clad laminate or the like, the stress releaser included in the above amount contributes to further improving adhesion to the metallic foil and moisture absorption resistance, thereby further improving through-hole connection reliability.

There are no particular limitations on a method for mixing individual components when manufacturing the organic insulator 1. Examples of the mixing method include a solution mixing method in which all the components are homogeneously dissolved or dispersed in a solvent, and a melt blend method including heating by an extruder or the like. A suitable solvent used for the solution mixing method is, for example, xylene. In this case, there are no particular limitations on mass ratio of a solid material (resin) to the solvent. For example, the mass ratio is 60:40 to 20:80. Besides xylene, an aromatic solvent such as toluene, benzene and ethylbenzene, a hydrocarbon-based solvent, such as normal hexane, cyclohexane and methylcyclohexane, a ketone-based solvent, such as acetone, or other solvent, such as tetrahydrofuran and chloroform may be used. Alternatively, xylene and any one of the above other solvents may be used together.

Figure 8:
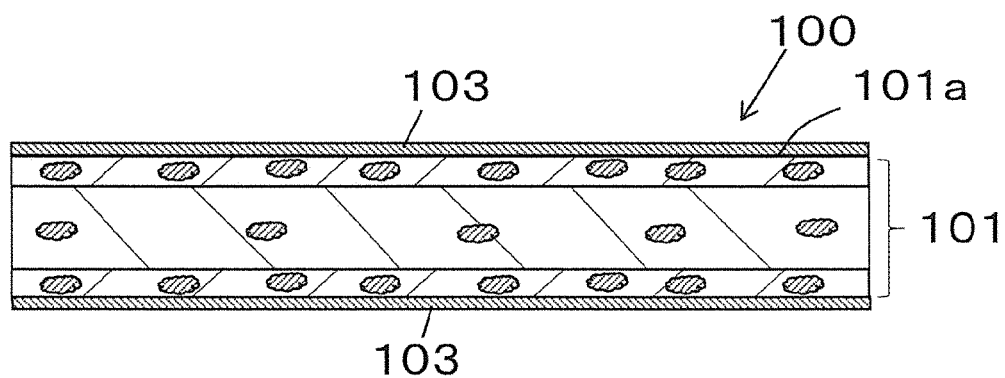
FIG. 8 is a sectional view schematically illustrating one embodiment of a metal-clad laminate in the present disclosure.

FIG. 8 is a sectional view schematically illustrating one embodiment of a metal-clad laminate. FIG. 8 illustrates one embodiment in which an organic insulator having a configuration similar to the organic insulator 21 illustrated in FIG. 4 is applied as an organic insulator 101. The metal-clad laminate 100 includes a metallic foil 103 on a surface 101a of an organic insulator 101. The metal-clad laminate 100 therefore has the dielectric characteristics and resistance to oxidation that are inherent in the organic insulator 21 described above. The metal-clad laminate 100 of the present embodiment is not limited thereto. The organic insulator 1, the organic insulator 41, the organic insulator 61 and the organic insulator 81 are also similarly applicable. In these cases, the metal-clad laminate 100 has characteristics, such as dielectric characteristics, resistance to oxidation, adhesion to the metallic foil, flame retardance and insulation properties, which are inherent in the organic insulator 1, the organic insulator 41, the organic insulator 61 and the organic insulator 81.

The metallic foil 103 is not particularly limited. Examples thereof include a copper foil, such as an electrodeposited copper foil and a rolled copper foil, an aluminum foil, and a composite foil composed of these metallic foils overlapped with one another. Of these metallic foils 103, for example, a copper foil is suitably used. Although there are no particular limitations on thickness of the metallic foil 103, for example, approximately 5-105 μm is preferred. A surface roughness Ra of the metallic foil 103 is preferably, for example, 0.5 μm or less, particularly 0.2 μm or less. For the reason for ensuring adhesive strength of the metallic foil 103 with respect to the organic insulator 101, the surface roughness (Ra) is preferably 0.05 μm or more at minimum.

The metal-clad laminate 100 is obtainable by stacking one upon another a predetermined number of the organic insulators 101 and a predetermined number of the metallic foils 103, followed by heat press molding. If a dissipation factor of the metal-clad laminate 100 is, for example, 0.004 or less, sufficient electrical characteristics, such as dielectric constant, can be demonstrated. The metal-clad laminate 100 is therefore usable, for example, for high-frequency wiring board.

Figure 9:
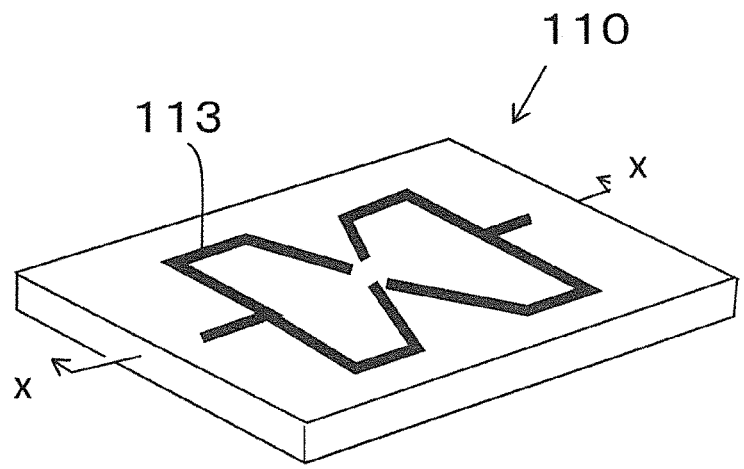
FIG. 9 is a sectional view schematically illustrating one embodiment of a wiring board in the present disclosure.
Figure 10:
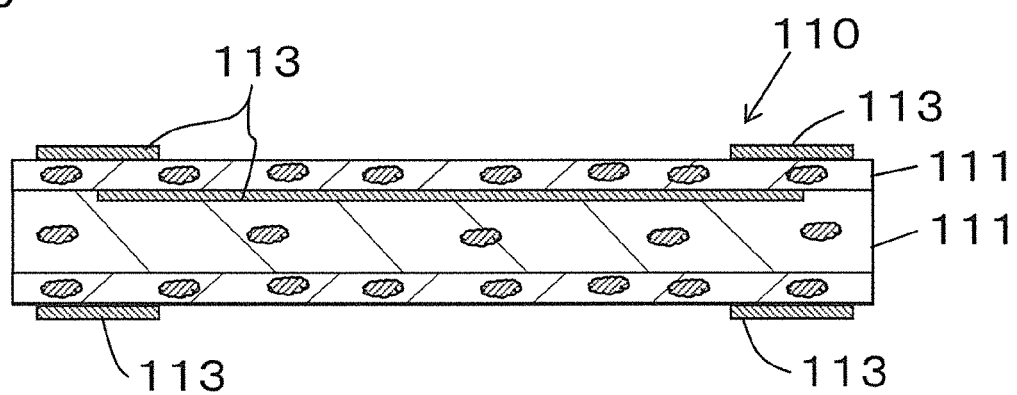
FIG. 10 is a sectional view taken along line X-X in FIG. 9.

FIG. 9 is a sectional view schematically illustrating one of embodiments of a wiring board. FIG. 10 is a sectional view taken along line X-X in FIG. 9. The wiring board 110 includes a plurality of insulating layers 111 and a metallic foil (conductor layer) 113 disposed between the insulating layers 111. The insulating layers 111 are preferably composed of, for example, the organic insulator 21. Also, in the wiring board 110, the insulating layer 111 is not limited to the organic insulator 21, but the organic insulator 1, the organic insulator 41, the organic insulator 61 and the organic insulator 81 are also applicable similarly. The wiring board 110 is also capable of having characteristics, such as dielectric properties, resistance to oxidation, adhesion to metallic foil, flame retardance and insulation properties, which are inherent in the organic insulator 1, the organic insulator 21, the organic insulator 41, the organic insulator 61 and the organic insulator 81.

The wiring board 110 is also applicable to a wiring board 110 having a cavity structure, besides a multilayer wiring board in which the insulating layer 111 and the metallic foil 113 are alternately multilayered. The wiring board 110 is obtainable, for example, by overlapping a prepreg and an inner layer plate including a circuit and a through hole formed on the metal-clad laminate 100, and by laminating the metallic foil 113 on a surface of the prepreg, followed by heat (curing) press molding. Alternatively, a multilayer printed circuit board may be made by further forming a circuit and a through hole on the metallic foil 113 located outermost.

For example, the wiring board 110 is obtainable through the step of preparing a resin composition serving as the organic insulator 21, the step of forming a half-cured insulating sheet by molding the resin composition into a sheet shape, the step of depositing the metallic foil 103 serving as a conductor layer on a surface of the insulating sheet, and the step of subjecting the insulating sheet with the metallic foil 103 deposited thereon to heat pressing predetermined conditions (temperature, pressure and atmosphere). The wiring board 110 thus obtained is suitable as the wiring board 110 for high frequency having excellent long-term reliability because the insulating phase 111 is formed by, for example, the organic insulator 1, 21, 41, 61 or 81.

A resin composition including a cyclic olefin copolymer having a crosslinkable functional group in a molecule, a monomer having at least two ethylenic unsaturated groups in a molecule, and a peroxide having a benzene ring in a molecule may be combined with a reinforcing material so as to be molded into a sheet-like molded article.

Examples of the reinforcing material include glass, woven fabrics and non-woven fabrics of fibers, such as polyimide, and papers. Examples of material for the glass include normal E glass, D glass, S glass and quartz glass.

The method for manufacturing the sheet-like molded article is not particularly limited. For example, inorganic particles may be dispersed into the resin composition and then molded in a sheet shape. Alternatively, the resin composition may be applied to or impregnated into a reinforcing material and then dried and molded in a sheet shape. Inorganic particles may be dispersed in the resin composition applied to or impregnated into the reinforcing material. Examples of the sheet-like molded article include a complex in which the inorganic particles are included in the resin composition, and a prepreg.

The inorganic particles and the reinforcing material included in the sheet-like molded article are preferably included in an amount of approximately 20-80 mass parts in total. If the inorganic particles and the reinforcing material are included in the above-mentioned amount, dimensional stability and strength of the sheet-like molded article after being cured are more likely to be demonstrated. A coupling agent, such as a silane-based coupling agent and a titanate-based coupling agent, may be added to the sheet-like molded article as needed.

As to whether or not the resin in the sheet-like molded article is the above-mentioned resin composition, components thereof can be checked by analysis using infrared spectroscopy (IR) and gas chromatography (GC). In addition, a composition is checkable by analysis using nuclear magnetic resonance spectroscopy (NMR) and mass spectrometry-gas chromatography (GC-MS). The resin in the sheet-like molded article is in an uncured or semi-cured state.

A method for manufacturing the sheet-like molded article is not particularly limited. One embodiment of the method includes uniformly dissolving or dispersing the resin composition in xylene or other solvent as needed, and applying to or impregnating this into a reinforcing material, followed by drying. The resin composition may be dissolved and impregnated into the reinforcing material. An application method and an impregnation method are not particularly limited. For example, there are a method in which a solution or dispersion of the resin composition is applied by using, for example, a spray, a brush or a bar coater; and a method in which a base material is dipped into a solution or dispersion of the resin composition (dipping). The application or impregnation can be repeated a plurality of times as needed. Alternatively, the application or impregnation can also be repeated using a plurality of solutions or dispersions which are different in resin concentration. Still alternatively, it is possible to employ a method including molding a resin composition including inorganic particles into a sheet shape, followed by semi-curing or curing.

The sheet-like molded article is processed into a laminate by being subjected to, for example, heat molding. The laminate is obtainable, for example, by laminating a plurality of sheet-like molded articles depending on a desired thickness and then laminating thereon sheets, such as metallic foils, and by subjecting an obtained laminate to heat (curing) press molding, followed by removing the sheets, such as the metallic foils. It is also possible to obtain a thicker laminate by combining the resulting laminate with another sheet-like molded article (for example, a prepreg). The lamination molding and curing are generally carried out simultaneously by using a heat pressing machine, but may be carried out separately. Specifically, a semi-cured laminate may be firstly obtained by lamination molding, and the semi-cured laminate is then completely cured by processing with a heat processing machine. The heat press molding is carried out, for example, at 80-300° C. under a pressure of 0.1-50 MPa for approximately 1 minute to 10 hours, or alternatively, may be carried out at 150-250° C. under a pressure of 0.5-10 MPa for approximately 10 minutes to 5 hours.

A metal-clad laminate or wiring board may be manufactured with the same method as described above by using the sheet-like molded article thus obtained.

Example

The above embodiments are described specifically by giving examples. However, there is no intension of limiting to these examples. Components used in the examples and comparative examples are as follows. As an organic insulator, there was manufactured a laminate structure type one composed of a plurality of unit layers in which organic resin phases were divided into layers. The metal-clad laminate in which a copper foil is attached to one surface or both surfaces of the organic insulator having the above structure was manufactured and characteristics thereof were evaluated.

A thermosetting cyclic olefin copolymer having a crosslinkable functional group (manufactured by Mitsui Chemicals, Inc.) was used as an organic resin phase. PERBUTYL D: di-t-butylperoxide (manufactured by NOF CORPORATION, having no benzene ring) was used as a peroxide having a benzene ring. The organic resin phase is composed by adding 1.8 mass parts of the PERBUTYL D (peroxide) to 100 mass parts of the cyclic olefin copolymer (COC).

Hindered amine-based polymer (Chimassorb944, manufactured by Ciba-Geigy AG) was used as a weather-resistant stabilizer. Silica particles having a mean particle diameter of 0.7 μm were used as inorganic particles. Brominated ethylene bis(pentabromobenzene) was used as a flame retardant.

Subsequently, the weather-resistant stabilizer, the inorganic particles and the flame retardant were blended so as to have compositions indicated in Table 1 with respect to 100 mass parts of the organic resin phase, into a composition obtained by adding the PERBUTYL D (peroxide) to the cyclic olefin copolymer, and these were agitated together at room temperature (25° C.), thereby preparing resin compositions different in addition amount of the weather-resistant stabilizer and inorganic particles.

Subsequently, a resin varnish was obtained by dissolving the obtained resin composition in xylene. A mass ratio of the resin composition and the xylene was 40:60. Then, the obtained resin varnish was molded into a sheet shape by using a bar coater, and this was dried at 150° C. for 4 minutes, thereby obtaining a sheet-like molded article having a thickness of 15 μm.

Subsequently, the obtained sheet-like molded article (hereinafter also referred to as the sheet) was cut into small pieces, and six pieces of them are overlapped and laminated one upon another in combinations presented in Table 2. A laminate was manufactured by laminating copper foils, each having a thickness of 18 μm, on both surfaces of a laminated object. Numbers that respectively indicate lamination positions presented in Table 2 correspond to numbers of the sheets laminated in order from one side of the laminate. In this case, the numbers I-1 and I-6 indicate positions of outermost layers, and I-2 to I-5 indicate positions individually corresponding to inner layers. Sample No. I-1 in Table 2 is an organic insulator in which addition amounts of the weather-resistant stabilizer included in all unit layers of the outermost layers and all unit layers of the inner layers are all 0.1 mass parts. Sample No. I-2 is an organic insulator in which addition amounts of the weather-resistant stabilizer included in all unit layers of the outermost layers and all unit layers of the inner layers are all 0.3 mass parts. Sample No. I-3 is an organic insulator in which addition amounts of weather-resistant stabilizer included in all unit layers of the outermost layers were all 0.3 mass parts while addition amounts of the weather-resistant stabilizer included in all unit layers of the inner layers are all 0.1 mass parts. Sample No. I-4 is an organic insulator in which addition amounts of the inorganic particles included in all unit layers of the outermost layers are smaller (namely, 15 mass parts) than in the organic insulator of Sample No. I-3. Sample No. I-5 is an organic insulator in which a sheet B is laminated only on one surface of the laminate. Sample No. I-6 is an organic insulator in which a sheet C is laminated only one surface of the laminate.

Subsequently, a copper-clad laminate having a thickness of approximately 120 μm was obtained by heating the laminate at 200° C. under pressure of 4 MPa for 120 minutes.

The organic insulator was taken out by separating the copper foils from the manufactured copper-clad laminate, and the organic insulators thus taken out was examined in terms of distribution states of the weather-resistant stabilizer, the inorganic particles and the flame retardant agent in a thickness direction. Specifically, the surface of the organic insulator was firstly polished extremely thinly. A fresh surface of the exposed organic insulator was observed through a scanning electron microscope, and regions different in color tone were roughly divided. A region having a large area ratio among the divided regions was determined as an organic resin phase. A region having a small area ratio was determined as a region including the weather-resistant stabilizer, the inorganic particles and the flame regardant agent.

In terms of the distribution of the weather-resistant stabilizer, the organic insulator was sequentially polished to expose fresh surfaces, and a specific element, a large amount of which was detectable from a region whose area ratio was low was identified by carrying out an X-ray spectroscopic analysis (XPS) on the sequentially exposed fresh surfaces. Additionally, a distribution of a specific element, which was not included in a region determined as the organic resin phase but was detectable from regions except for the organic resin phase, was also examined. A distribution of nitrogen (N) was measured as the specific element. In terms of content ratio of the weather-resistant stabilizer, a count of nitrogen (N) indicated by the X-ray spectroscopic analysis (XPS) apparatus in an interior of the organic insulator (at a position whose depth in a thickness direction was approximately 50 μm) was compared with that in a surface region of the organic insulator. A content of the weather-resistant agent in the surface region was obtained from an average value of the counts of the element in a range of the surface region which were indicated by the X-ray spectroscopic analysis (XPS) apparatus. A content of the weather-resistant stabilizer in the interior was obtained from an average value of counts obtained by carrying out the X-ray spectroscopic analysis (XPS) on three to five locations at a midportion in the thickness direction of the organic insulator. In each of Samples (Sample Nos. I-3 to I-6) different in addition amount of the weather-resistant stabilizer, a content ratio of the weather-resistant stabilizer included in the surface region of the organic insulator became approximately three times a content ratio thereof included in the interior. Of the manufactured samples, each of Sample Nos. I-3 to I-6 has such a structure that a portion having a high content ratio of the weather-resistant stabilizer was layered.

The distribution of the inorganic particles was obtained from an area ratio of the inorganic particles projected on a cross-sectional photograph obtainable through the scanning electron microscope. In this case, the area ratio of the inorganic particles in the surface region of the organic insulator was an average value of area ratios obtained in a range of 3 μm or more but 6 μm or less from a main surface of the organic insulator. The area ratio of the inorganic particles in the interior of the organic insulator was obtained by carrying out the same analysis as described above on three to five locations at the midportion (at a depth of approximately 50 μm) in the thickness direction of the organic insulator. Thereafter, a ratio of the area ratio of the inorganic particles in the surface region of the organic insulator and the area ratio of the inorganic particles in the interior was obtained from comparison. In Sample Nos. I-4 and I-6 of the manufactured samples, the area ratio of the inorganic particles in the surface region of the organic insulator was approximately 0.6 times the area ratio of the inorganic particles in the interior.

The flame retardant agent was analyzed with the scanning electron microscope including the energy dispersive X-ray analyzer. In terms of the flame regardant agent, a distribution of bromine (Br) was evaluated, and a difference between the surface region of the organic insulator and the interior thereof was examined. When a content ratio of the flame retardant agent included in the interior of the organic insulator is taken as 1, a content ratio of the flame retardant agent included in the surface region was 0.97 or more but 1.02 or less in the individual samples. A ratio of a content ratio of the weather-resistant stabilizer included in the surface region in the manufactured organic insulator to a content ratio of the weather-resistant stabilizer included in an inner region thereof is larger than a ratio of a content ratio of the flame retardant included in the surface region to a content ratio of the flame retardant agent included in the inner region.

The manufactured organic insulators of the individual samples were in a state in which interfaces between the unit layers were recognizable by observing a cross section taken by the scanning electron microscope. All the samples had such a structure that neither the weather-resistant stabilizer nor the inorganic particles were included in a region having a thickness of ±3 μm in a thickness direction from the interfaces. This is because the sheet-like molded article shortly after being manufactured is in a state in which the organic resin phase covers the weather-resistant stabilizer and the inorganic particles in the surface thereof.

The organic insulator was taken out by separating the copper foils from the obtained copper-clad laminate, and a dissipation factor at 30 GHz in the organic insulator thus taken out was measured with balanced-type circular disk resonator method. The samples after being left at room temperature (25° C.) and 125° C. for 1000 hours were individually measured in terms of dissipation factor. The results are presented in Table 2.

Adhesive strength of the copper foils was measured using the manufactured copper-clad laminate. Peel strength of the copper foils was measured with a method of pulling the copper foil in a vertical direction from the surface of the organic insulator by using an autograph. An average value was obtained by setting the number of the samples to five. The peel strength of Sample No. I-5 was measured on a side of the sheet B. The peel strength of Samples No. I-6 was measured on a side of the sheet C. The results are presented in Table 2.

A burning test was carried out according to UL94V burning test method. A test piece cut out from the organic insulator was vertically attached to a clamp. A flame contact with a 20 mm flame was carried out, and time was measured until the flame disappeared from the sample being the organic insulator. The number of samples was set to five. All the manufactured samples had flammability that satisfied UL94 V0.

In terms of glass transition temperature (Tg), the obtained organic insulators were subjected to dynamic viscoelastic measurement (DMA) to measure behaviors of dissipation factor. A peak temperature of the dissipation factor was found as a glass transition temperature (Tg). The results are presented in Table 2.

TABLE 1

| Type of sheet-like molded article | Weather-resistant stabilizer Mass parts | Inorganic particles Mass parts | Flame retardant agent Mass parts |
|---|---|---|---|
| Sheet A | 0.1 | 25 | 25 |
| Sheet B | 0.3 | 25 | 25 |
| Sheet C | 0.3 | 15 | 25 |

TABLE 2

| | | | | | Dissipation factor (30 GHz) | | | |
|---|---|---|---|---|---|---|---|---|
| | Outermost layers | | Other layers including inner layers | | After being left at high temperatures (Left at room | After being left at room temperature | Peel | Glass transition temperature |
| Sample No. | Type of sheet | Lamination position | Type of sheet & Number of Sayers | Lamination position | temperature (25° C.)) | 125° C. for 1000 hours | strength kN/m | (Tg) ° C. |
| I-1 | Sheet A | 1.6 | Sheet A, 4 layers | 2-5 | 0.0015 | 0.004 | 0.3 | 150 |
| I-2 | Sheet B | 1.6 | Sheet B, 4 layers | 2-5 | 0.0015 | 0.0025 | 0.6 | 130 |
| I-3 | Sheet B | 1.6 | Sheet A, 4 layers | 2-5 | 0.0015 | 0.0025 | 0.6 | 148 |
| I-4 | Sheet C | 1.6 | Sheet A, 4 layers | 2-5 | 0.0015 | 0.0025 | 0.7 | 148 |
| I-5 | Sheet B | 1 | Sheet A, 5 layers | 2-6 | 0.0015 | 0.0033 | 0.6 | 149 |
| I-6 | Sheet C | 1 | Sheet A, 5 layers | 2-6 | 0.0015 | 0.0033 | 0.7 | 149 |

As apparent from the results in Table 2, in Sample Nos. I-3 to I-6, in which the content ratio of the weather-resistant stabilizer included in the unit layers of the outermost layers of the organic insulator was larger than in the interior thereof, the dissipation factor after being left at 125° C. for 1000 hours was 0.0033 or less and the glass transition temperature (Tg) was 148° C. or higher. The peel strength of the copper foil was 0.6 kN/m or more. In Samples (Sample Nos. I-4 and I-6) among these samples, in which the content ratio of the inorganic particles included in the unit layers of the outermost layers was lower than in the interior, the peel strength was 0.7 kN/m.

In contrast, in the samples (Sample Nos. I-1 and I-2) manufactured so that the content ratio of the weather-resistant agent in the outermost layers of the organic insulator was the same as that in the interior, the dissipation factor after being left at 125° C. for 1000 hours was as high as 0.04, or the glass transition temperature (Tg) was as low as 130° C.

Organic insulators were separately prepared as follows, and characteristics (glass transition temperature (Tg), dielectric constant and dissipation factor) were evaluated.

(Component (A): Cyclic olefin copolymer)

COC: cyclic olefin copolymer having a crosslinkable functional group (manufactured by Mitsui Chemicals, Inc.)

(Component (B): Monomer in which the number of ethylenic unsaturated groups is 2 or more)

A-DCP: Tricylodecane dimethanol diacrylate (manufactured by SHIN-NAKAMURA CHEMICAL CO., LTD.)

DCP: Tricylodecane dimethanol dimethacrylate (manufactured by SHIN-NAKAMURA CHEMICAL CO., LTD.)

TRIC: Triallyl isocyanurate (manufactured by Nihon Kasei CO., LTD.)

(Peroxide)
PERCUMYL D: Dicumyl peroxide (having a benzene ring, manufactured by NOF CORPORATION)
(Flame retardant agent)
SAYTEX8010: 1,2-bis(2,3,4,5,6-pentabromophenyl)ethane (manufactured by Albemarle Corporation)
(Spherical silica)
SFP-30M, methacryl treatment (manufactured by Denka Company Limited)

A cyclic olefin copolymer and a monomer in which the number of ethylenic unsaturated groups was 2 or more selected from the above components were mixed together at a ratio presented in Table 1, and an amount of 1.8 mass parts of the peroxide, an amount of 25 mass parts of the flame retardant agent and an amount of 25 mass parts of the spherical silica were added to 100 mass parts of the cyclic olefin copolymer. The obtained mixture was stirred at room temperature (25° C.) to obtain a resin composition. The obtained resin composition was dissolved in xylene to obtain resin varnish. A mass ratio of the resin composition and the xylene was 40:60. A sheet was manufactured from the obtained resin varnish by using a bar coater, followed by drying treatment at 150° C. for 4 minutes. The manufactured sheet had a thickness of approximately 15 μm.

Subsequently, the sheet was cut into small pieces and eight pieces of them were laminated one upon another, and a copper foil having a thickness of 18 μm was overlaid on both surfaces thereof. This was heated at 180° C. under pressure of 4 MPa for 120 minutes, thereby manufacturing a copper-clad laminate having a thickness of approximately 0.14 mm.

A sample processed into a predetermined size was manufactured by separating the copper foil from the obtained copper-clad laminate. A monomer having an ethylenic unsaturated group was detected from the manufactured sample by thermal desorption gas chromatographic analysis.

A glass transition temperature (Tg) and electrical characteristics of the manufactured sample were measured. Sizes of the sample whose glass transition temperature (Tg) was measured were 8 mm length and 50 mm width. The glass transition temperature (Tg) was measured with a dynamic viscoellastic measuring device (DMA). The results are present in Table 3.

As the electrical characteristics, dielectric constant and dissipation factor were measured. Sizes of the sample were 50 mm length and 50 mm width. A cavity resonator method was used for measuring these electrical characteristics. Measuring conditions were room temperature (25° C.) and a frequency of 30 GHz. The dissipation factor was measured under conditions where the sample was left at 125° C. The results are presented in Tables 3 and 4.

TABLE 3

| Sample No. | COC (Mass parts) | Monomer having an ethylenic unsaturated group Mass parts | Number of ethylenic unsaturated groups | Tg (° C.) | Dielectric constant [30 GHz] | Dissipation factor [30 GHz] |
|---|---|---|---|---|---|---|
| II-1 | COC (100) | A-DCP (1.0) | 2 | 147 | 2.7 | 0.0016 |
| II-2 | COC (100) | A-DCP (5.0) | 2 | 154 | 2.7 | 0.0015 |
| II-3 | COC (100) | A-DGP (7.5) | 2 | 165 | 2.7 | 0.0019 |
| II-4 | COC (100) | A-DCP (15.0) | 2 | 170 | 2.7 | 0.0021 |
| II-5 | COC (100) | DCP (1.0) | 2 | 146 | 2.7 | 0.0014 |
| II-6 | COC (100) | DCP (5.0) | 2 | 151 | 2.7 | 0.0015 |
| II-7 | COC (100) | TAIC (1.0) | 3 | 145 | 2.7 | 0.0015 |
| II-8 | COC (100) | TAIC (5.0) | 3 | 148 | 2.7 | 0.0014 |
| II-9 | COC (100) | A-DCP (0.9) | 2 | 143 | 2.7 | 0.0016 |
| II-10 | COC (100) | A-DCP (16) | 2 | 175 | 2.7 | 0.0025 |
| II-11 | COC (100) | — | — | 141 | 2.7 | 0.0016 |

TABLE 4

| Sample No. | Dissipation factor (30 Ghz) 125° C. 0 h | 125° C. 1000 h |
|---|---|---|
| II-2 | 0.0015 | 0.0039 |
| II-5 | 0.0015 | 0.0041 |
| II-8 | 0.0014 | 0.0042 |
| II-11 | 0.0016 | 0.0046 |

As presented in Table 3, each of Sample Nos. II-1 to II-10 had a glass transition temperature (Tg) of 143° C. or higher, a dielectric constant of 2.7 and a dissipation factor of 0.0025 or less. In contrast, Sample No. II-11 had a dielectric constant of 2.7 and a dissipation factor of 0.0016, but had a glass transition temperature (Tg) of 141° C.

As presented in Table 4, a dissipation factor was measured after Sample Nos. II-2, II-5, II-8 and II-11 among the samples presented in Table 3 were left under environments of a temperature of 125° C. Even after 1000 hours, the dissipation factors of Sample Nos. II-2, II-5 and II-8 were 0.0042 or less, whereas that of Sample No. II-11 was as high as 0.0046.

DESCRIPTION OF THE REFERENCE NUMERALS

1, 21, 41, 61, 81, 101 organic insulator
3, 23, 43, 63, 83 organic resin phase
5, 25, 45, 65, 85 weather-resistant stabilizer
9, 29, 49, 69, 89 inner region
11, 31, 51, 71, 91 surface region
13, 33, 53, 73, 93 inorganic particles
95 (95a, 95b, 95c, 95d, 95e) unit layer interface
100 metal-clad laminate
103, 113 metallic foil
110 wiring board

The invention claimed is:

1. An organic insulator, comprising an organic resin phase as a main component,
the organic resin phase comprising a weather-resistant stabilizer,
the organic resin phase comprising an inner region and a surface region formed in at least one surface of the inner region,
the surface region having a higher content ratio of the weather-resistance stabilizer than the inner region,
wherein the organic resin phase comprises a thermosetting resin,
and
wherein the thermosetting resin is a cured material of a resin composition comprising a cyclic olefin copolymer having a crosslinkable functional group in a molecule, a monomer having at least two ethylenic unsaturated groups in a molecule,
and a peroxide having a benzene ring in a molecule.

2. The organic insulator according to claim 1, wherein the organic insulator has a plate shape and,
the surface region is present in a main surface having a largest area among surfaces of the organic insulator.

3. The organic insulator according to claim 2, wherein the surface region is present in two opposing main surfaces in the inner region.

4. The organic insulator according to claim 1, wherein the organic resin phase further comprises inorganic particles, and a content ratio of the inorganic particles in the surface region is lower than in the inner region.

5. The organic insulator according to claim 1, wherein the organic resin phase further comprises a flame retardant agent and has a relationship of SO/SI>FO/FI where SI is a content ratio of the weather-resistant stabilizer included in the inner region, SO is a content ratio of the weather-resistant stabilizer included in the surface region, FI is a content ratio of the flame retardant agent included in the inner region, and FO is a content ratio of the flame retardant agent included in the surface region.

6. The organic insulator according to claim 1, wherein the surface region has a layer shape.

7. The organic insulator according to claim 1, wherein the organic resin phase comprises a laminate structure comprising a plurality of unit layers laminated one upon another.

8. The organic insulator according to claim 7, wherein an interface where the unit layers are overlapped with each other has a lower content ratio of at least one of the weather-resistant stabilizer and the inorganic particles than portions of the unit layers except for the interface.

9. The organic insulator according to claim 1, wherein the organic resin phase comprises a thermoplastic resin.

10. The organic insulator according to claim 9, wherein a main component of the thermoplastic resin is a cyclic olefin copolymer.

11. The organic insulator according to claim 1, wherein the thermosetting resin comprises mainly of a cyclic olefin copolymer and comprises a peroxide having a benzene ring.

12. The organic insulator according to claim 1, wherein the monomer having the ethylenic unsaturated groups comprises at least one kind selected from the group consisting of tricylodecane dimethanol diacrylate, tricylodecane dimethanol dimethacrylate and triallyl isocyanurate.

13. The organic insulator according to claim 1, wherein the monomer having the ethylenic unsaturated groups is included in an amount of 1 mass parts or more but 8 mass parts or less relative to 100 mass parts of the cyclic olefin copolymer.

14. The organic insulator according to claim 1, further comprising 1,2-bis(2,3,4,5, 6-pentabromophenyl)ethane as a flame retardant agent.

15. A metal-clad laminate, comprising:
an organic insulator according to claim 1, and
a metallic foil laminated on at least one surface of the organic insulator.

16. A wiring board, comprising:
a plurality of insulating layers composed of an organic insulator according to claim 1; and
a metallic foil disposed between the insulating layers.

* * * * *